(12) United States Patent
Pinkhasov et al.

(10) Patent No.: US 8,724,355 B1
(45) Date of Patent: May 13, 2014

(54) MULTISTAGE AMPLIFICATION AND HIGH DYNAMIC RANGE RECTIFICATION CIRCUIT

(75) Inventors: Aleksey Pinkhasov, Forest Hills, NY (US); Paul Sheehy, Easton, PA (US); Julio Canelo, San Jose, CA (US); Nishant Dhawan, Jersey City, NJ (US)

(73) Assignee: Anadigics, Inc., Warren, NJ (US)

( * ) Notice: Subject to any disclaimer, the term of this patent is extended or adjusted under 35 U.S.C. 154(b) by 196 days.

(21) Appl. No.: 13/413,970

(22) Filed: Mar. 7, 2012

Related U.S. Application Data (60) Provisional application No. 61/452,049, filed on Mar. 11, 2011.

(51) Int. Cl.
*H02M 7/217* (2006.01)
*G05F 1/613* (2006.01)

(52) U.S. Cl.
USPC .............. 363/127; 363/80; 323/315; 323/317

(58) Field of Classification Search
USPC ........ 363/125–127, 178, 49, 77, 80; 323/311, 323/312, 315, 316, 317
See application file for complete search history.

(56) References Cited

U.S. PATENT DOCUMENTS

| | | | | |
|---|---|---|---|---|
| 4,523,105 A | * | 6/1985 | Jose et al. ...................... | 327/104 |
| 5,097,403 A | * | 3/1992 | Smith ............................ | 363/127 |
| 5,367,247 A | * | 11/1994 | Blocher et al. ................ | 323/222 |
| 6,204,980 B1 | * | 3/2001 | Momtaz et al. ................. | 360/29 |
| 6,657,417 B1 | * | 12/2003 | Hwang ........................... | 323/222 |
| 6,900,623 B2 | * | 5/2005 | Yang et al. ..................... | 323/282 |
| 7,173,481 B2 | * | 2/2007 | Kimura .......................... | 327/541 |
| 8,436,597 B2 | * | 5/2013 | Sicard ........................... | 323/280 |

OTHER PUBLICATIONS

Yang, Chao et al., "Precise RSSI with High Process Variation Tolerance," IEEE International Symposium on Circuits and Systems, May 2007, pp. 2870-2873.

Khorram, S. et al., "A CMOS Limiting Amplifier and Signal-Strength Indicator," 1995 Symposium on VLSI Circuits Digest of Technical Papers, Jun. 1995, pp. 95-96.

* cited by examiner

*Primary Examiner* — Adolf Berhane
*Assistant Examiner* — Nusrat Quddus
(74) *Attorney, Agent, or Firm* — William L. Botjer (57) ABSTRACT

A circuit exhibiting rectification and amplification characteristics. In particular, a full-wave rectifier, wherein the rectifier has the ability to simultaneously amplify and rectify an input voltage. The circuit comprises transconductor circuit, rectifying circuit and amplifying circuit. The transconductor circuit is adapted for receiving an input voltage from at least one voltage source. The input voltage is then converted into intermediate currents by the transconductor circuit. Thereafter, the rectifying circuit rectifies the intermediate currents current to produce a rectified current. Lastly, the amplification circuit amplifies the input voltage to produce the amplified voltage.

8 Claims, 7 Drawing Sheets

FIG. 7

MULTISTAGE AMPLIFICATION AND HIGH DYNAMIC RANGE RECTIFICATION CIRCUIT

CROSS REFERENCE TO RELATED APPLICATIONS

This application claims priority from the U.S. provisional application No. 61/452,049 titled: "RECTIFICATION AND AMPLIFICATION CIRCUITRY" filed Mar. 11, 2011 the disclosure of which is hereby incorporated by reference.

TECHNICAL FIELD

The present disclosure relates, in general, to electronic circuits or components. More specifically, the present disclosure relates to a rectification and amplification circuit.

BACKGROUND

Electronic components/circuits are very important as the functioning of consumer electronics, industrial and household appliances depend on them. Various examples of electronic components are rectifiers, battery chargers, inverters, uni-directional or bi-directional converters, diodes, transistors, clippers, dampers, etc. Of these, rectifiers are widely used in the electronics industry and find a huge number of applications in our day-to-day life. The applications include deriving Direct Current (DC) power from an Alternating Current (AC) supply, power supplies, and detecting amplitude modulated radio signals.

Rectifiers are electronic components used for converting an Alternating Current (AC) into a Direct Current (DC). Rectifiers take the current that flows alternately in both directions and modifies it so that the output current flows only in one direction. The process of conversion of AC to DC is termed as rectification. Rectifiers are broadly classified as half-wave rectifier and full-wave rectifier.

Figure 1:
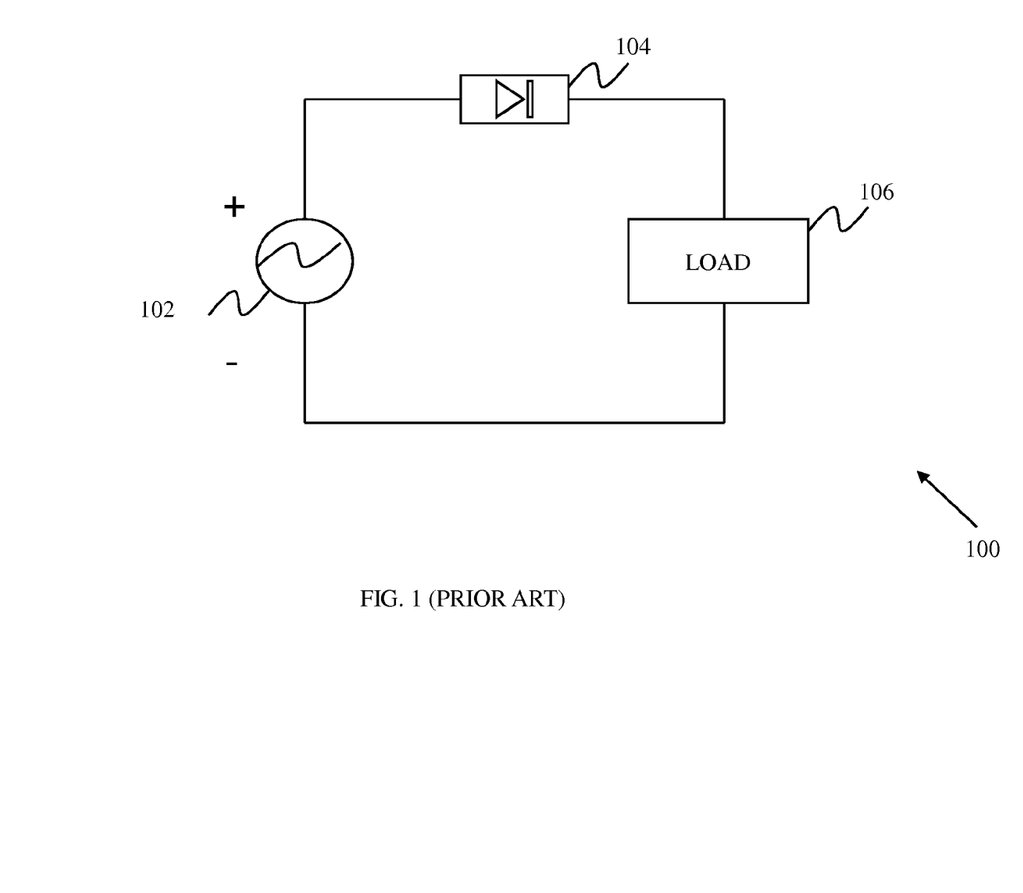
FIG. 1 is a schematic circuit representation of a conventional half-wave rectifier.

In a half-wave rectifier, only one half of an AC wave, i.e. either the positive or the negative half is allowed to pass, while the other half is eliminated. The output of a half-wave rectifier can be achieved with a single diode connected in between a power supply and a load resistance or load reactance. FIG. 1 shows a conventional half-wave rectifier circuit 100. FIG. 1 is shown to include an AC power supply 102, a diode 104, and a load 106. AC power supply 102 is connected to diode 104. Diode 104 is further connected to load 106, generating an output waveform. Load 106 can be a resistive load or a reactive load. Diode 104 is forward-biased and reverse-biased alternatively during every cycle of the AC wave. Further, diode 104 only passes one half of the AC wave during the forward-biased condition and blocks the other half of the AC wave during the reverse-biased condition. The output waveform at load 106 thus has a DC component.

Similar to the half-wave rectifier, a full-wave rectifier also produces DC output; however, it consists of two or more diodes connected to a single load resistance or reactance. Each diode supplies current to the load, in isolation from the other diode. Also, at least one of the diodes is always active during either the positive or negative cycle of an input AC wave. Therefore, the full-wave rectifier converts both polarities of the input AC wave to DC. Full-wave rectifiers are more efficient as compared to the half-wave rectifiers and have some fundamental advantages over the half-wave rectifiers. The output of a full-wave rectifier has much less ripple than the output of a half-wave rectifier and thus, produces a smoother output waveform.

Rectifiers are also commonly used as received signal strength indicators (RSSI). As the name suggests, RSSIs are used to measure the strength of an incoming signal. In general, a signal strength indicator circuit receives an input RF signal and produces an output, which is equivalent to the strength of the input signal. If the output voltage is high, then the signal strength is also high and vice-versa. An RSSI is commonly used in Automatic Gain Control (AGC) loops. Depending on the received signal power, the signal is amplified using an amplifier to boost the signal if it is too low or attenuated using an attenuator if it is too high. There are a number of consumer devices with inbuilt RSSI circuits, such as cell phones, wireless network adapters, and remote controls. Moreover, antennas contain RSSI circuits that help in aligning the antenna for maximum signal reception.

A number of Complementary metal-oxide-semiconductor (CMOS) solutions are available in the market that utilizes rectification techniques employed in RSSI implementations. However, such solutions require a lot of additions and subtractions to the current during the rectification process, which in turn requires very precise mathematics to be implemented. High precision further requires use of a long/large gate length to be utilized in such solutions. Typically, the gate length means the channel/region length representing the movement of the electrons and/or holes between two terminals formed inside the devices, for example, a Metal-Oxide-Semiconductor Field-Effect Transistor (MOSFET). Typically, a MOSFET is employed in electronic circuits for the purpose of amplifying or switching electronic signals. Large gate length leads to large gate area, resulting in large capacitance, which in turn leads to poor frequency response. If the existing circuit designs have a small gate length; it becomes very difficult to achieve such precision, due to large variations in device characteristics in the process for minimal gate length devices. There are RSSI implementations for devices having a large gate length, thereby providing good matching of characteristics of various components in the circuit. However, such designs fail to work at very high frequencies. These designs perform badly as they can operate only at a limited frequency range.

In view of the aforesaid challenges, there exists a need for a circuit design that operates in a broad frequency spectrum and achieves a large dynamic range with the circuit exhibiting rectification as well as amplification characteristics. Moreover, the circuit design should be simple and the circuit should employ minimum gate length.

SUMMARY

An objective of the present disclosure is to provide a rectification and amplification circuit that achieves broadband frequency response by utilizing the minimum gate length available in given process.

Yet another objective of the present disclosure is to convert a differential voltage into a rectified current.

Further, another objective of the present disclosure is to provide a rectification and amplification circuit performing both rectification and amplification.

Another objective of the present disclosure is to amplify a differential voltage.

An additional objective of the present disclosure is to cascade a plurality of rectifier circuits to achieve a large dynamic rectification range.

Embodiments of the present disclosure provide a rectification and amplification circuit for generating a rectified current and an amplified voltage. The circuit comprises a first transconductor and a second transconductor. Further, the first transconductor and the second transconductor receive a first input voltage $V_{in\_a}$ and a second input voltage $V_{in\_b}$ respectively and convert a differential voltage between the first input voltage and the second input voltage to intermediate currents. The sum of intermediate currents has a magnitude of a tail current being provided by a first current source and a second current source connected to the first transconductor and the second transconductor respectively. A rectifying circuit converts the differential voltage ($V_{in\_a}-V_{in\_b}$) into the intermediate currents and selectively sums the intermediate currents to obtain the rectified current. Further, an amplifying circuit amplifies the differential voltage ($V_{in\_a}-V_{in\_b}$) to an amplified voltage, wherein the amplified voltage corresponds to the difference between a first output voltage and a second output voltage.

BRIEF DESCRIPTION OF THE DRAWINGS

Various embodiments of the disclosure will, hereinafter, be described in conjunction with the appended drawings provided to illustrate and not to limit the disclosure, wherein like designations denote like elements, and in which.

DETAILED DESCRIPTION OF THE PREFERRED EMBODIMENTS

This application describes a circuit operating as a full-wave rectifier as well as an amplifier. In particular, the present application is directed to a novel full-wave rectifier implementation, including the ability to simultaneously amplify and rectify the input voltage/current. The full-wave rectifier operates on broad frequency spectrum.

For the sake of simplicity and better understanding of the disclosure, the terminologies/devices, which will be used later to describe the figures, are explained herein with their corresponding meanings/definitions.

A Metal-Oxide-Semiconductor Field-Effect Transistor (MOSFET) is generally employed in electronic circuits for the purpose of amplifying or switching electronic signals. The basic MOSFET include three terminals such as a gate, a source and a drain. The metal oxide-insulated gate electrode forms a conducting medium between the source and the drain. Further, the MOSFET may be of two types i.e. nMOSFET or pMOSFET depending on the type of medium i.e. n-type or p-type respectively. Typically, nMOSFETs are used for implementing N-type metal-oxide-semiconductor (NMOS) logic in various known logic gates and other digital circuits. Also, nMOSFETs have four modes of operation: cut-off (or sub-threshold), triode, saturation (sometimes called active), and velocity saturation. Similarly, pMOSFETs are used for implementing P-type metal-oxide-semiconductor (PMOS) logic in various known logic gates and other digital circuits. Similar to the NMOS, pMOSFETs have four modes of operation: cut-off (or sub-threshold), triode, saturation (sometimes called active), and velocity saturation. As described above, nMOSFETs and pMOSFETs may be termed as NMOS transistors and PMOS transistors respectively.

Electrical resistance is the characteristic of an electrical element, which relates to the opposition of electric current flowing through the electrical element. The electrical elements made specifically for the purpose of providing opposition to the electric current in an electrical circuit are known as resistors. The resistors are made by keeping in mind various factors such as desired resistance, amount of energy that it needs to dissipate, precision, cost and the like.

Transconductance is a property of the transconductors, which can be defined as the ratio of current change at an output port to voltage change at an input port. It is usually represented as $g_m$. In case of MOSFET's, transconductance is defined as the ratio of change in drain/source current to change in gate/source voltage, provided the drain/source voltage is constant.

A current mirror represents a circuit that utilizes current of one of the active devices of a circuit, to control the current in another active device of the circuit.

Current sources refer to any type of appropriate sources which inputs the current to a circuit.

Figure 2:
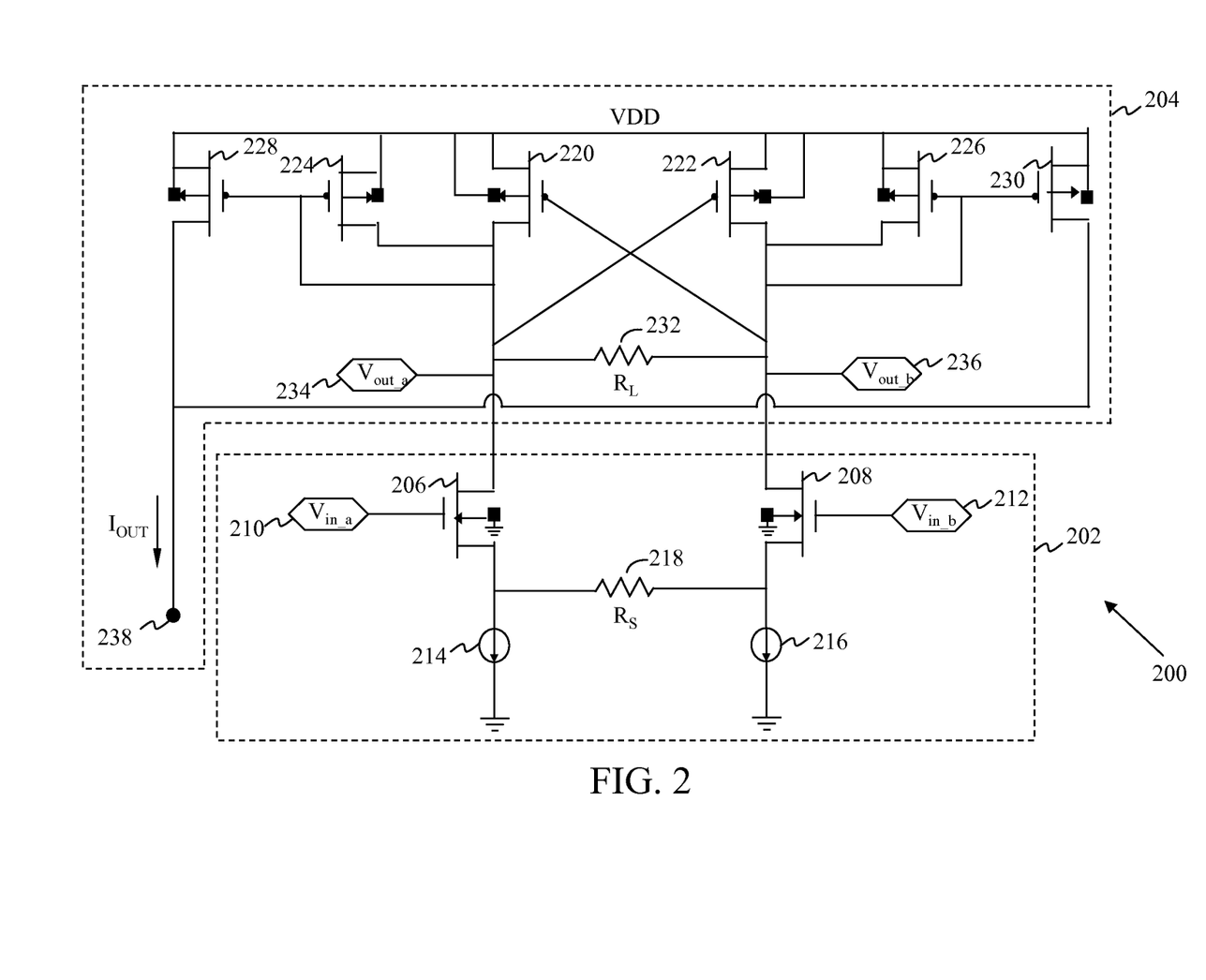
FIG. 2 is an exemplary circuit diagram of a rectification and amplification circuit performing simultaneous rectification and amplification, in accordance with an embodiment of the disclosure.

FIG. 2 illustrates an exemplary circuit diagram of a rectification and amplification circuit 200 performing simultaneous rectification and amplification, in accordance with an embodiment of the disclosure. It will be apparent to those skilled in the art that the system components described herein can be applied to any other embodiment of the present disclosure.

FIG. 2 includes an input portion 202 and an output portion 204. Input portion 202 includes a seventh transistor 206, an eighth transistor 208, a first input voltage source 210, a second input voltage source 212, a first current source 214, a second current source 216 and a source resistance 218. Output portion 204 includes a first transistor 224, a second transistor 220, a third transistor 226, a fourth transistor 222, a fifth transistor 228, a sixth transistor 230, a load resistance 232, a first output voltage terminal 234, a second output voltage terminal 236 and an output current terminal 238.

First current source 214 and second current source 216 may be implemented in multiple ways to produce a tail current referred to as $I_{TAIL}$. First current source 214 and second current source 216 may have a large gate length and are further implemented to provide current of a pre-defined value to rectification and amplification circuit 200. Further, first current source 214 and second current source 216 with a large gate length do not have a significant effect on the frequency response of rectification and amplification circuit 200.

In accordance with an embodiment of the present disclosure, seventh transistor 206 and eighth transistor 208 are transconductors which are converting an incoming differential voltage to a current as an output.

In accordance with another embodiment of the present disclosure, first transistor 224, second transistor 220, third transistor 226, fourth transistor 222, fifth transistor 228, sixth transistor 230, seventh transistor 206, and eighth transistor 208 are one or more of a Bipolar Junction Transistor (BJT), Heterojunction bipolar transistor (HBT), a Metal Semiconductor Field Effect Transistor (MESFET), a Junction gate Field Effect Transistor (JFET), a Metal Oxide Semiconductor Field Effect Transistor (MOSFET), and a Pseudomorphic High Electron Mobility Transistor (pHEMT).

In accordance with an embodiment of the present disclosure, first transistor 224, second transistor 220, third transistor 226, fourth transistor 222, fifth transistor 228 and sixth transistor 230 are complimentary to seventh transistor 206 and eighth transistor 208. For example, if seventh transistor 206 and eighth transistor 208 are N-Channel Metal Oxide Semiconductor (NMOS) transistors, then first transistor 224, second transistor 220, third transistor 226, fourth transistor 222, fifth transistor 228 and sixth transistor 230 are P-Channel Metal Oxide Semiconductor (PMOS) transistors.

In accordance with an embodiment of the present disclosure, rectification and amplification circuit 200 may include CMOS components. The CMOS components may be of various CMOS technologies such as, but not limited to, 0.35 μm CMOS and 0.18 μm CMOS. Additionally, the circuit may be implemented using other advanced technologies to achieve better performance over frequency. First transistor 224, second transistor 220, third transistor 226, fourth transistor 222, fifth transistor 228, and sixth transistor 230 are hereinafter referred to as PMOS1 224, PMOS2 220, PMOS3 226, PMOS4 222, PMOS5 228, and PMOS6 230 respectively. Further, seventh transistor 206 and eighth transistor 208 are hereinafter referred to as NMOS1 206 and NMOS2 208 respectively.

In the rectification and amplification circuit 200 as shown in FIG. 2, source terminals of NMOS1 206 and NMOS2 208 are connected to first terminals of first current source 214 and second current source 216 respectively. Second terminals of first current source 214 and second current source 216 are connected to a ground. A gate terminal of NMOS1 206 is connected to first input voltage source 210 and a gate terminal of NMOS2 208 is connected to second input voltage source 212. Bulk terminals of NMOS1 206 and NMOS2 208 are connected to the ground. Source resistance 218 is connected between the source terminals of NMOS1 206 and NMOS2 208. Drain terminals of NMOS1 206 and NMOS2 208 are connected to drain terminals of PMOS2 220 and PMOS4 222 respectively. Bulk terminals and source terminals of PMOS2 220 and PMOS4 222 are connected to a supply voltage $V_{DD}$. A gate terminal of PMOS1 224 is connected to the drain terminal of PMOS2 220. The drain terminal of PMOS2 220 is connected to the drain terminal of NMOS1 206.

Further, a drain terminal of PMOS3 226 is connected to the drain terminal of PMOS4 222. The drain terminal of PMOS4 222 is connected to the drain terminal of NMOS2 208. Bulk terminals and source terminals of PMOS1 224 and PMOS3 226 are connected to the supply voltage $V_{DD}$. A gate terminal of PMOS3 226 is connected to the drain terminal of PMOS4 222. PMOS4 222 and PMOS2 220 are cross coupled to each other. The gate terminal of PMOS4 222 and the gate terminal of PMOS2 220 are cross coupled with the drain terminal of PMOS2 220 and the drain terminal of PMOS4 222 respectively. Load resistance 232 is connected between the drain terminals of PMOS2 220 and PMOS4 222.

Furthermore, gate terminals of PMOS5 228 and PMOS6 230 are connected to the gate terminals of PMOS1 224 and PMOS3 226 respectively. Bulk terminals and source terminals of PMOS5 228 and PMOS6 230 are connected to the supply voltage $V_{DD}$. Drain terminals of PMOS5 228 and PMOS6 230 are connected to output current terminal 238.

First output voltage terminal 234 is connected to the drain terminal of PMOS2 220 and the drain terminal of NMOS1 206. Second output voltage terminal 236 is connected to the drain terminal of PMOS4 222 and the drain terminal of NMOS2 208.

In an embodiment of the present disclosure, PMOS1 224 and PMOS3 226 are diode connected. In an embodiment of the present disclosure, PMOS5 228 and PMOS6 230 are implemented as current mirror for PMOS1 224 and PMOS3 226 respectively. Therefore, PMOS5 228 and PMOS6 230 copy the current flowing in PMOS1 224 and PMOS3 226 respectively.

In accordance with an embodiment, PMOS1 224, PMOS2 220, PMOS3 226, and PMOS4 222 may be of equal size. In accordance with another embodiment of the present disclosure, the size of PMOS1 224, PMOS2 220, PMOS3 226, and PMOS4 222 may vary, as per the design requirements.

Figure 3:
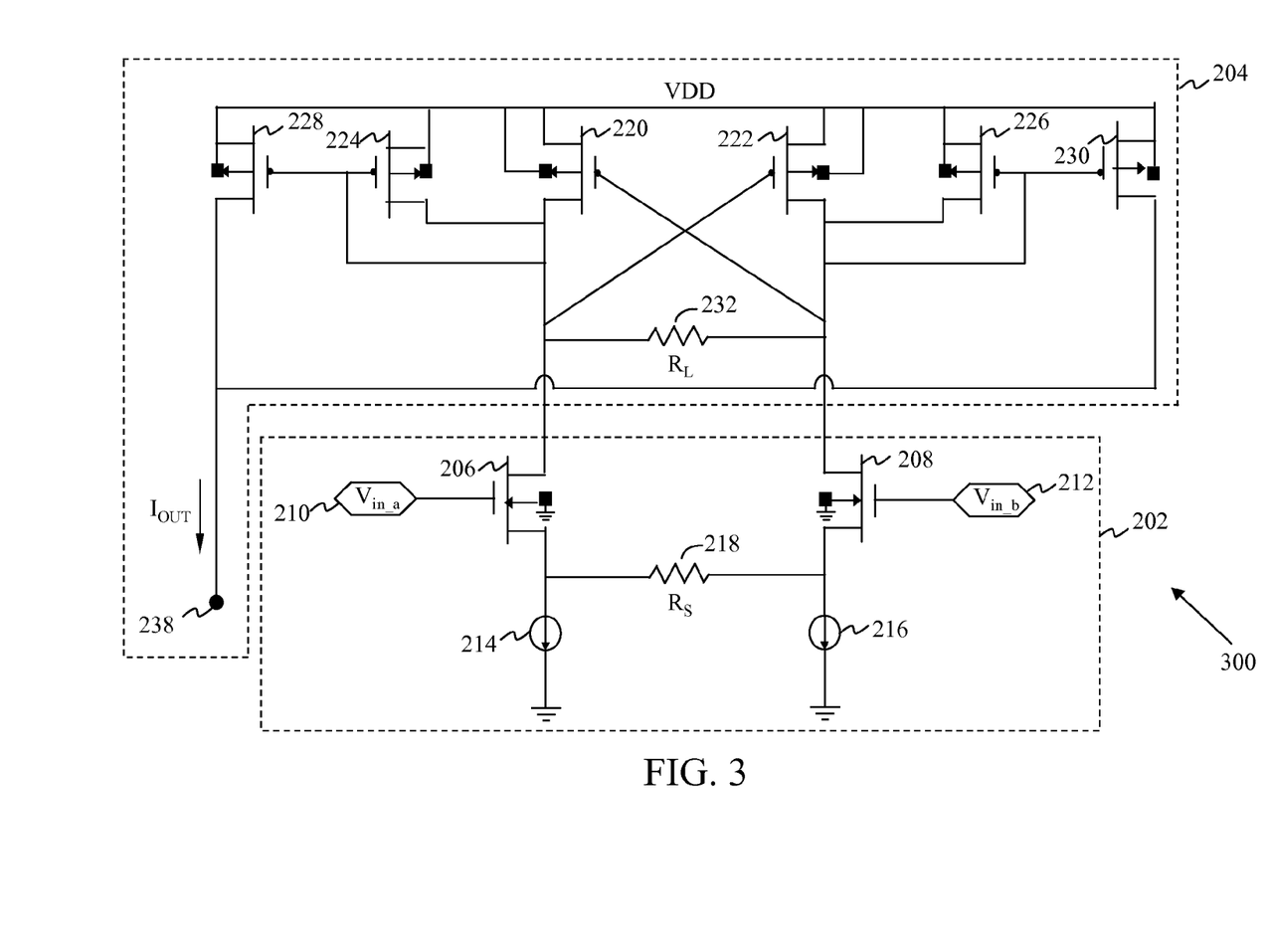
FIG. 3 is an exemplary circuit diagram of a rectification and amplification circuit performing rectification, in accordance with an embodiment of the disclosure.

FIG. 3 illustrates an exemplary circuit diagram of a rectification and amplification circuit 300 performing rectification, in accordance with an embodiment of the disclosure. Rectification and amplification circuit 300 includes the elements illustrated to be a part of rectification and amplification circuit 200 (refer to FIG. 2) except for first output voltage terminal 234 and second output voltage terminal 236 which have been removed. Further, rectification and amplification circuit 300 has a component connection configuration identical to rectification and amplification circuit 200.

In FIG. 3, the gate terminal of NMOS1 206 receives a first input voltage $V_{in\_a}$ from first input voltage source 210 and the gate terminal of NMOS2 208 receives a second input voltage $V_{in\_b}$ from second input voltage source 212. A differential voltage $V_{DIFF}$ is defined as a difference between the first input voltage $V_{in\_a}$ and the second input voltage $V_{in\_b}$, i.e., $V_{DIFF}=(V_{in\_a}-V_{in\_b})$. NMOS1 206 and NMOS2 208 convert the differential voltage into intermediate currents. The sum of the intermediate currents has a magnitude of the tail current $I_{TAIL}$ provided by first current source 214 and second current source 216.

Further, source resistance 218 is implemented to adjust the effective transconductance of a differential pair comprising of NMOS1 206 and NMOS2 208. The value of source resistance 218 may be varied to control an output gain. Source resistance 218 controls a rectified current $I_{OUT}$ and eventually the gain of rectification and amplification circuit 200.

In accordance with an embodiment of the present disclosure when the differential voltage $V_{DIFF}=0$, only the tail current $I_{TAIL}$ flows in rectification and amplification circuit 300. Further, equal voltage at NMOS1 206 and NMOS2 208 provides equal value of input gate to source voltage (i.e. $V_{gs}$) in each of PMOS1 224, PMOS2 220, PMOS3 226, and PMOS4 222. Consequently, the intermediate current flowing through each of PMOS1 224, PMOS2 220, PMOS3 226, and PMOS4 222 is of similar value. Accordingly, the tail current $I_{TAIL}$ coming from input portion 202 is equally divided between PMOS1 224, PMOS2 220, PMOS3 226 and PMOS4 222 and the same is represented by equation (1), as shown below. The equation depicts the mathematical representation of the said scenario.

$$I_{DSP1} = I_{DSP2} = I_{DSP3} = I_{DSP4} = \frac{I_{TAIL}}{4} \tag{1}$$

where, $I_{DSP1}$, $I_{DSP2}$, $I_{DSP3}$ and $I_{DSP4}$ correspond to the intermediate currents flowing through PMOS1 224, PMOS2 220, PMOS3 226, and PMOS4 222 respectively.

According to the equation (1) above, the intermediate currents flowing through PMOS1 224 and PMOS3 226 is of the value of $I_{TAIL}/4$. Thereafter, the intermediate currents flowing through PMOS1 224 and PMOS3 226 are copied by PMOS5 228 and PMOS6 230, respectively. As described above, PMOS5 228 and PMOS6 230 are implemented as a current mirror for PMOS1 224 and PMOS3 226 respectively. The intermediate currents flowing through PMOS1 224 and PMOS3 226 are mirrored by PMOS5 228 and PMOS6 230, respectively. Further, the drain terminals of PMOS5 228 and PMOS6 230 are connected to output current terminal 238 and hence provide the rectified current $I_{OUT}$. The rectified current $I_{OUT}$ is the sum of intermediate currents flowing in PMOS5 228 and PMOS6 230 and the same is shown by following equation (2):

$$I_{out} = I_{DSP5} + I_{DSP6} = \frac{I_{TAIL}}{4} + \frac{I_{TAIL}}{4} = \frac{I_{TAIL}}{2} \bigg|_{V_{DIFF}=0} \quad (2)$$

where, $I_{DSP5}$ and $I_{DSP6}$ correspond to the intermediate currents flowing through PMOS5 228 and PMOS6 230, respectively.

In the above equation 2, the value of $I_{OUT}$ is half of the tail current $I_{TAIL}$. Therefore, when the differential voltage $V_{DIFF}$ of value zero, i.e. $V_{DIFF}=0$, is applied to the input terminal of output portion 204, the rectified current $I_{OUT}$ will be half of the value of the tail current $I_{TAIL}$, as calculated by the equation (2).

In accordance with another embodiment of the present disclosure when the differential voltage $V_{DIFF}>>0$, the entire tail current $I_{TAIL}$ flows through NMOS1 206 and no tail current $I_{TAIL}$ flows through NMOS2 208. No tail current $I_{TAIL}$ flows through PMOS4 222 or PMOS3 226 since they are connected to NMOS2 208, leading to drain voltage of PMOS4 222 to be high. Since the gate terminal of PMOS2 220 is connected to the drain terminal of PMOS4 222, PMOS2 220 is turned off. Subsequently, the entire tail current $I_{TAIL}$ flows through PMOS1 224 since it is connected to NMOS1 206.

In the above scenario, the entire tail current $I_{TAIL}$, supplied by the drain terminal of NMOS1 206 flows through PMOS1 224, whose drain terminal is connected to the drain terminal of NMOS1 206. Therefore, the entire tail current $I_{TAIL}$ flows through PMOS1 224, which is copied by PMOS5 228 (while acting as a current mirror) and PMOS5 228 provides the entire tail current $I_{TAIL}$ as the rectified current $I_{OUT}$ at output current terminal 238. Hence, the rectified current $I_{OUT}$ is equal to the current that flows through PMOS1 224, i.e. $I_{TAIL}=I_{OUT}$. This is represented by an equation (3) shown below: (3)

$$I_{OUT}=I_{DSN1}=I_{DSP1}=I_{TAIL} \quad (3)$$

where, $I_{DSP1}$ corresponds to the intermediate current flowing through PMOS1 224 and $I_{DSN1}$ corresponds to current flowing through NMOS1 206.

In accordance with another embodiment of the present disclosure when the differential voltage $V_{DIFF}<<0$, the entire tail current $I_{TAIL}$ flows through NMOS2 208 and no tail current $I_{TAIL}$ flows through NMOS1 206. Therefore, no tail current $I_{TAIL}$ flows through PMOS1 224 or PMOS2 220 since their drain terminals are connected to NMOS1 206, leading to drain voltage of PMOS2 220 to be high. Since the gate terminal of PMOS4 222 is connected to the drain terminal of PMOS2 220, PMOS4 222 is turned off. Subsequently, the entire tail current $I_{TAIL}$ flows through PMOS3 226 since it is connected to NMOS2 208.

In the above scenario, the entire tail current $I_{TAIL}$, supplied by the drain terminal of NMOS2 208 flows through PMOS3 226, whose drain terminal is connected to the drain terminal of NMOS2 208. Therefore, the entire tail current $I_{TAIL}$ flows through PMOS3 226, which is copied by PMOS6 230 (acting as a current mirror) and which provides the entire tail current $I_{TAIL}$ as the rectified current $I_{OUT}$ at output current terminal 238. Hence, the rectified current $I_{OUT}$ is equal to the current that flows through PMOS3 226, i.e. $I_{TAIL}=I_{OUT}$. This scenario is represented by an equation (4) below $$I_{OUT}=I_{DSN2}=I_{DSP3}=I_{TAIL} \quad (4)$$

where, $I_{DSP3}$ corresponds to the intermediate current flowing through PMOS3 226 and $I_{DSN2}$ corresponds to current flowing through NMOS2 208.

In view of the above illustration of various working scenarios of the circuit shown in FIG. 3, it is apparent that the rectified current $I_{OUT}$ is increasing monotonically with the value of differential voltage $V_{DIFF}$, for example, $I_{OUT}$ is minimum at $V_{DIFF}=0$ and maximum at $|V_{DIFF}|>>0$. Such, monotonically increasing characteristic of the rectified current $I_{OUT}$ with respect to the magnitude of differential voltage $V_{DIFF}$ establishes the rectification nature of rectification and amplification circuit 300, hence the circuit shown in FIG. 3 can be said to perform rectification.

Figure 4:
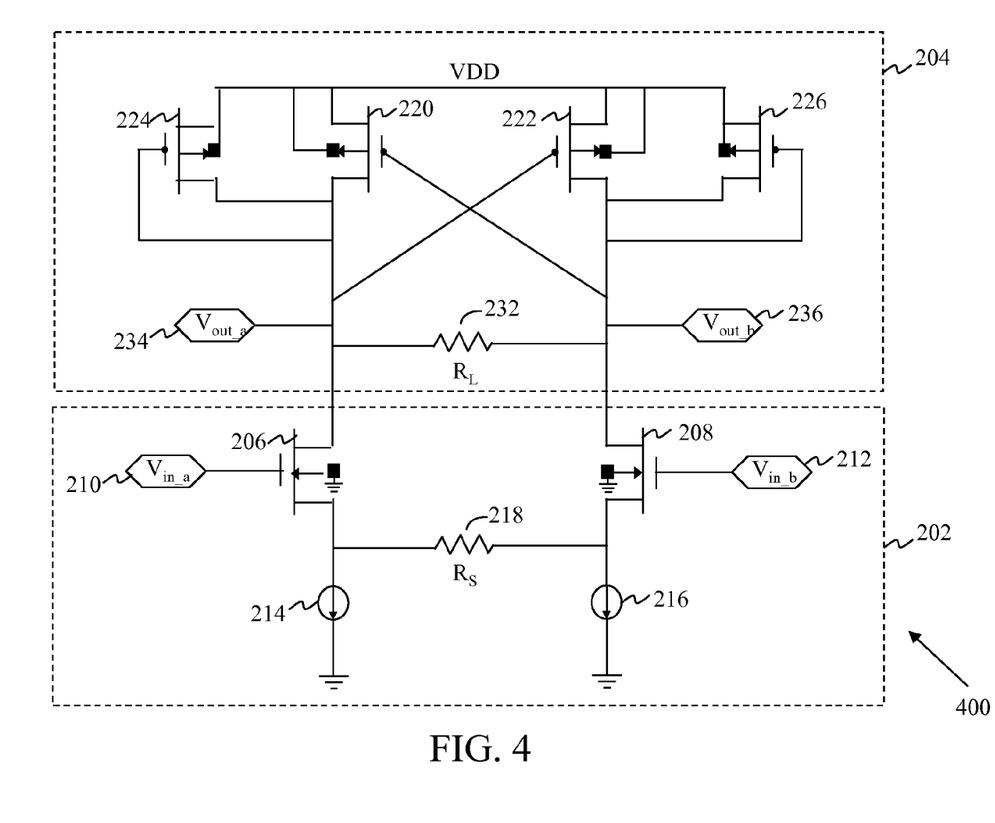
FIG. 4 is an exemplary circuit diagram of a rectification and amplification circuit performing amplification, in accordance with an embodiment of the disclosure.

FIG. 4 illustrates an exemplary circuit diagram of a rectification and amplification circuit 400 performing amplification, in accordance with an embodiment of the disclosure. Rectification and amplification circuit 400 includes the elements illustrated to be a part of rectification and amplification circuit 200 (refer to FIG. 2) except for PMOS5 228, PMOS6 230, and output current terminal 238 which have been removed. Further, rectification and amplification circuit 400 has a component connection configuration identical to rectification and amplification circuit 200. It will be apparent to those skilled in the art that the system components described herein can be applied to any other embodiment of the present disclosure.

The working of the circuit shown in FIG. 4 is explained in conjunction with FIG. 3. Since rectification and amplification circuit 400 performs amplification, the output of the circuit is measured from first output voltage terminal 234 and second output voltage terminal 236. First output voltage terminal 234 provides a first output voltage $V_{out\_a}$ and second output voltage terminal 236 provides a second output voltage $V_{out\_b}$. Further, an amplified voltage $V_{out}$ will be a differential output voltage, which is the difference between the first output voltage $V_{out\_a}$ and the second output voltage $V_{out\_b}$, i.e. $V_{out}=V_{out\_a}-V_{out\_b}$.

In accordance with an embodiment of the present disclosure, the circuit shown in FIG. 4 is a fully balanced circuit. The term balanced circuit is well known to a person of ordinary skill in the art and is therefore not explained in detail for sake of brevity.

In accordance with an embodiment of the present disclosure, amplification of a differential voltage is performed by the circuit shown in FIG. 4 and it has a gain of value higher than unity. Such amplification process performed by rectification and amplification circuit 400 may be described by using half-circuit analogy, since the circuit is fully balanced.

The NMOS transistors (i.e. NMOS1 206 and NMOS2 208) have reasonably high impedance looking into the drain in common source configuration. On the other hand, the impedance of diode-connected PMOS transistors, i.e. PMOS1 224 and PMOS3 226, is low and equal to 1/gm in parallel with ro. Also, since PMOS2 220 and PMOS4 222 are cross-coupled, PMOS2 220 has input impedance equal to −1/gm in parallel with ro. This −1/gm output impedance of PMOS2 220 cancels the 1/gm output impedance of PMOS1 224. Therefore, the impedance at first output voltage terminal 234 is of reasonably high value and equal to ro/2. Further, load resistance 232 may be used to control the gain in conjunction with effective transconductance formed by NMOS1 206, NMOS2 208 and source resistance 218.

Output impedance, $R_{out}$, at first output voltage terminal 234 may be calculated by the following equation (5):

$$Rout = \frac{1}{\frac{1}{ro_{p1}} + gm_{p1} + \frac{1}{ro_{p2}} - gm_{p2}} \| ro_{n1} \| \frac{R_L}{2} \quad (5)$$

Assuming that $gm_{p1}=gm_{p2}=gm_p$, $ro_{p1}=ro_{p2}=ro_p$
Where,
gm is defined as Device Transconductance $$gm = \frac{dI_{ds}}{dV_{gs}} [\Omega^{-1}]$$

$r_o$ is defined as Device Output Impedance $$ro = \frac{dI_{ds}}{dV_{ds}} [\Omega]$$

$$Rout = \frac{ro_p}{2} \| ro_{n1} \| \frac{R_L}{2} \quad (6)$$

If $R_L$ is chosen such that $$\frac{ro_p}{2} \| ro_{n1} \gg \frac{R_L}{2}$$

then $$Rout = R_L/2 \quad (6)$$

Then the total gain is:

$$Av = Gm \cdot Rout = \frac{gm_n}{1 + gm_n \cdot \frac{R_s}{2}} \cdot \frac{R_L}{2} \quad (7)$$

The equation (7) could be further simplified assuming that $$1 \ll gm_n \cdot \frac{R_S}{2}$$

$$Av = Gm \cdot Rout = \frac{R_L}{R_S} \quad (8)$$

A more general equation is given below (8a)

$$Av = \quad (8a)$$
$$Gm \cdot Rout = \frac{gm_n}{1 + gm_n \cdot \frac{R_S}{2}} \cdot \left[ \frac{1}{\frac{1}{ro_{p1}} + gm_{p1} + \frac{1}{ro_{p2}} - gm_{p2}} \| ro_{n1} \| \frac{R_L}{2} \right]$$

Since the voltage gain of rectification and amplification circuit 400 is reasonably high, i.e. greater than unity, it means that rectification and amplification circuit 400 shown in FIG. 4 performs amplification.

In accordance with an embodiment of the present disclosure, a detection range of rectification and amplification circuit 200 as shown in FIG. 2 may be calculated in the following manner:

$$I_{OUT}=I_{DSP5}+I_{DSP6}$$

Assuming perfect mirroring of current by PMOS5 228 and PMOS6 230, we can rewrite the above equation as follows:

$$I_{OUT}=I_{DSP1}+I_{DSP3}$$

For $V_{DIFF}>0$ and assuming that $gm_{p1}=gm_{p3}=gm_p$ $$I_{DSP1} = \frac{I_{TAIL}}{4} - \frac{V_{DIFF}}{2} \cdot Av \cdot gm_p \quad (9)$$

$$I_{DSP3} = \frac{I_{TAIL}}{4} + \frac{V_{DIFF}}{2} \cdot Av \cdot gm_p \quad (10)$$

As long as $$V_{DIFF} < \frac{I_{TAIL}}{2 \cdot Av \cdot gm_p},$$

the rectified current $I_{OUT}$ remains the same. Since the minimum value for each branch, $I_{DSP1}$ and $I_{DSP2}$, is zero, we can obtain a minimum value for the differential input voltage, using the following equation (11), beyond which rectification and amplification circuit 400 begins to rectify:

$$V_{MIN} = \frac{I_{TAIL}}{2 \cdot Av \cdot gm_p} \quad (11)$$

Furthermore, rectification and amplification circuit 400 will run out of range when $$\frac{3 \cdot I_{TAIL}}{4} = \frac{V_{DIFF}}{2} \cdot Av \cdot gm_p,$$

leads to $$V_{MAX} = \frac{3 \cdot I_{TAIL}}{2 \cdot Av \cdot gm_p} = V_{MIN} + \frac{I_{TAIL}}{Av \cdot gm_p} \quad (12)$$

Moreover, the minimum and maximum value of the first input voltage $V_{in\_a}$ and the second input voltage $V_{in\_b}$ for the circuit shown in FIG. 2 is given by equations (11) and (12).

In accordance with an embodiment of the present disclosure, rectification and amplification circuit 200 shown in FIG. 2 performs the operation of a rectifier as shown in FIG. 3, and also performs the operation of an amplifier as shown in FIG. 4. This unique feature of the circuit may be utilized to produce a large dynamic range rectifier, if we replicate rectification and amplification circuit 200 several times.

Figure 5:
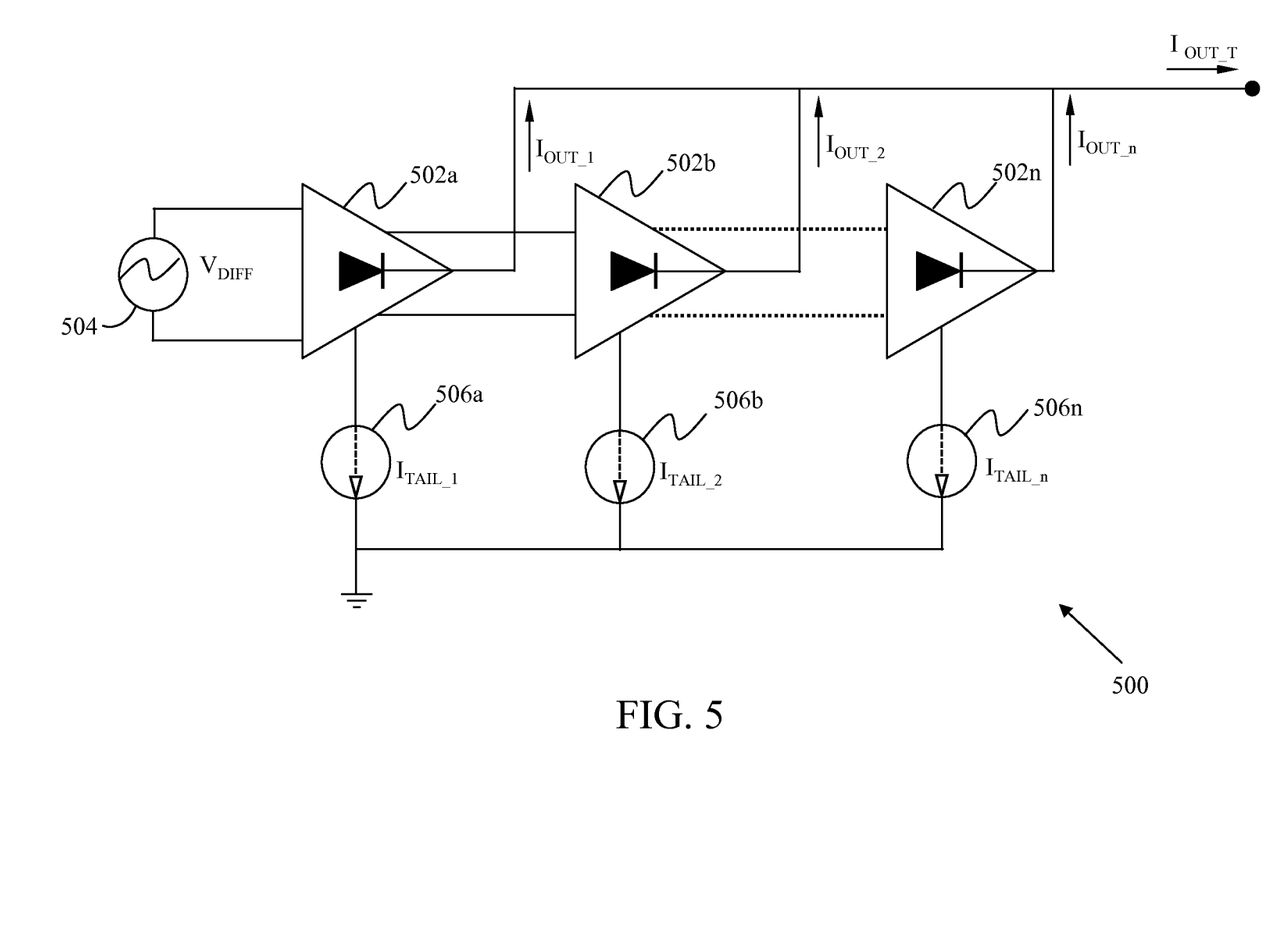
FIG. 5 is an exemplary circuit illustrating cascaded multiple stages of a rectification and amplification circuit, in accordance with an embodiment of the disclosure.

FIG. 5 represents an exemplary circuit illustrating a multistage rectification and amplification circuit 500, in accordance with an embodiment of the present disclosure. The FIG. 5 is explained in conjunction with FIG. 2, FIG. 3 and FIG. 4. It will be apparent to those skilled in the art that the system components described herein can be applied to any other embodiment of the present disclosure.

The circuit shown in FIG. 5 includes a plurality of stages of rectification and amplification circuits. Each stage respectively includes rectification and amplification circuits 502a, 502b and 502n and respective current sources 506a, 506b, and 506n.

Each of rectification and amplification circuits 502a, 502b and 502n corresponds to rectification and amplification circuit 200. The rectification and amplification circuit of a first stage is connected to a common differential voltage source 504, providing differential input voltage $V_{DIFF}$. The first output voltage terminal and the second output voltage terminal of the rectification and amplification circuit of the each stage are connected to a subsequent stage and respectively provide the first input voltage $V_{in\_a}$ and the second input voltage $V_{in\_b}$ to the rectification and amplification circuit of the subsequent stage. The rectified currents $I_{OUT\_a}$, $I_{OUT\_b}$ and $I_{OUT\_n}$ of each stage of cascaded multiple stage rectification and amplification circuit 500 is aggregated to provide a total rectified current $I_{OUT\_Total}$. Further, tail currents $I_{TAIL\_1}$, $I_{TAIL\_2}$, and $I_{TAIL\_n}$ of current sources 506a, 506b, and 506n respectively are connected to the ground. In accordance with an embodiment of the present disclosure, the functioning of each of the plurality of circuits 300 has been described earlier in the document, in detail, in conjunction with FIG. 3 (i.e. for performing rectification) and FIG. 4 (i.e. for performing amplification)

Further, in the circuit shown in FIG. 5, the gain and rectification range of each stage of rectification and amplification circuit 500 should be set in such a way that if one of the stages goes out of range, then the other stages perform the operation of rectification.

In accordance with an exemplary embodiment of the present disclosure, the implementation of the circuit in FIG. 5 may be realized by utilizing, but not limited to, 0.35 μm CMOS technology. In such an implementation, three circuits are cascaded, wherein each circuit (stage) has been provided with a similar gain and rectification range. The value of other variables is as follows:

$gm_n$=13.5 mA/V
$ro_n$=3.3 kΩ
$ro_p$=6.7 kΩ
Rs=100Ω
RL=2.5 kΩ

Now, the total gain of the above mentioned circuit may be computed by the following equation (13):

$$Av = Gm \cdot Rout = \frac{gm_n}{1+gm_n \cdot \frac{R_S}{2}} \cdot \left[ \frac{1}{\frac{1}{ro_{p1}} + gm_{p1} + \frac{1}{ro_{p2}} - gm_{p2}} \| ro_{n1} \| \frac{R_L}{2} \right] \quad (13)$$

If we incorporate the above mentioned values in equation (13), the value of total gain is obtained, as shown below $A_v$=6.5 [V/V].

In order to obtain a higher dynamic frequency range, more stages may be combined.

Figure 6:
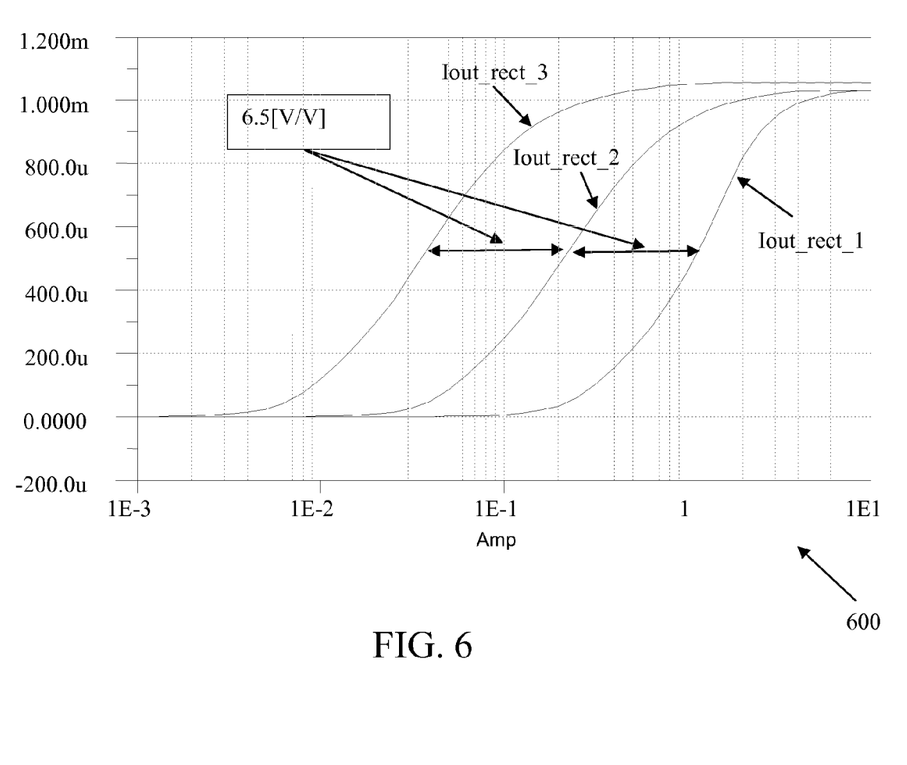
FIG. 6 shows an exemplary graphical representation of the performance of a rectification and amplification circuit, in accordance with an embodiment of the disclosure.

FIG. 6 shows an exemplary graphical representation of the performance of a rectification and amplification circuit 200, in accordance with an embodiment of the present disclosure. FIG. 6 depicts a graph 600 showing the relationship between amplitude and rectified current $I_{OUT}$ of each stage used (three stages totals) in the cascade of amplification rectification circuits as depicted in FIG. 5. The graph is shown in terms of linear curves representing the performance of rectification and amplification circuit 200. As shown in the FIG. 6, each of the linear curves are separated by a gain of 6.5 [v/v], hence a similar value of gain for each of rectification and amplification circuit 200 is obtained when calculated by the equation (13) discussed above.

Figure 7:
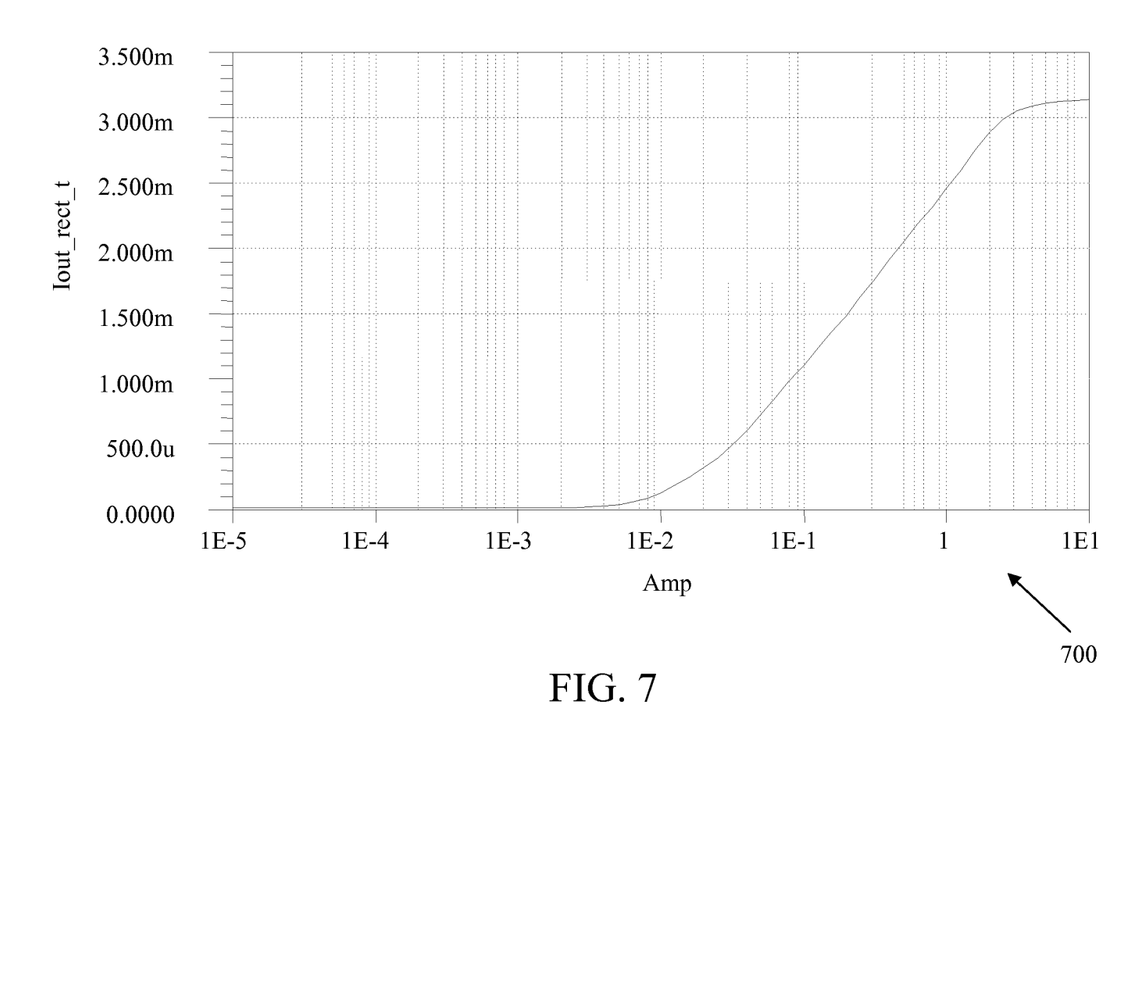
FIG. 7 is another exemplary graphical representation of the performance of a rectification and amplification circuit, in accordance with an embodiment of the disclosure.

FIG. 7 is another exemplary graphical representation of the performance of a rectification and amplification circuit 200, in accordance with an embodiment of the present disclosure. The performance of rectification and amplification circuit 200, as demonstrated in FIG. 5, is shown in terms of graphical analysis 700. Graphical analysis 700 demonstrates a relation between the amplitude and rectified current $I_{OUT}$ current that is shown using a linear curve.

Most high-precision current mode rectifiers implemented in CMOS technology primarily depend on the mathematics of the circuit, i.e., addition and subtraction of currents. As a result, these designs need to be implemented with great precision. Precise current mirrors require large gate length components which, in turn, degrade the frequency response of the circuit.

However, the design described above in the present disclosure does not rely very much on a precision current mirror implementation. If we refer to equations (2) and (4), shown below for convenience, the rectified current depends mostly on $I_{TAIL}$, which does not have much of an effect on the bandwidth.

$$I_{OUT} = I_{DSP5} + I_{DSP6} = \frac{I_{TAIL}}{4} + \frac{I_{TAIL}}{4} = \frac{I_{TAIL}}{2} \Big|_{V_{DIFF}=0}$$

$$I_{OUT} = I_{DSN2} = I_{DSP4} = I_{TAIL} |_{V_{DIFF}>>0}$$

The above description is made assuming that first transistor 224, second transistor 220, third transistor 226, fourth transistor 222, fifth transistor 228, and sixth transistor 230 are PMOS transistors, and seventh transistor 206, and eighth transistor 208 are NMOS transistors. However, those of ordinary skill in the art will appreciate that the same circuit can work without change of any scope when first transistor 224, PMOS2 220, third transistor 226, fourth transistor 222, PMOS5 228 and PMOS6 230 are transistors other than the PMOS transistor. Similarly, NMOS1 206 and NMOS2 208 can be any other transistor, different from the NMOS transistor but still complementary to first transistor 224, PMOS2 220, third transistor 226, fourth transistor 222, PMOS5 228 and PMOS6 230.

A circuit exhibiting rectification and amplification characteristics, or any of its components, as described in the present disclosure, may be embodied in the form of devices like, but not limited to, power control loop devices. For another embodiment, the components of the present disclosure may be embodied in the form of an embedded controller. Typical examples of embedded controllers include a general-purpose computer, a programmable microprocessor, a micro controller, a peripheral integrated circuit element, ASIC's (Application Specific Integrated Circuit), PLC's (Programmable Logic Controller), devices and other devices or arrangements of devices that are capable of implementing the steps that constitute the method for the present disclosure. In addition to this, the amplification and rectification circuit can also be implemented using any three terminal device, but are not limited to, a Bipolar Junction Transistor (BJT), a Metal Semiconductor Field Effect Transistor (MESFET), a Junction gate field-effect transistor (JFET) and a Metal Oxide Semiconductor Field Effect Transistor (MOSFET).

While various embodiments of the disclosure have been illustrated and described, it will be clear that the disclosure is not limited only to these embodiments. Numerous modifications, changes, variations, substitutions, and equivalents will be apparent to those skilled in the art, without departing from the spirit and scope of the disclosure.

What is claimed is:

1. A multi-stage rectification and amplification circuit comprising a plurality of stages of rectification and amplification circuits, each rectification and amplification circuit generating a rectified current and an amplified voltage, the rectification and amplification circuit of each stage comprising:
   a first transconductor and a second transconductor configured to:
      receive a first input voltage $V_{in\_a}$ and a second input voltage $V_{in\_b}$ respectively; and
      convert a differential voltage between the first input voltage and the second input voltage to intermediate currents, the sum of intermediate currents having a magnitude of a tail current being provided by a first current source and a second current source connected to the first transconductor and the second transconductor respectively;
   a rectifying means configured to convert the differential voltage ($V_{in\_a}$-$V_{in\_b}$) into the intermediate currents and selectively sum the intermediate currents to obtain the rectified current; and
   an amplifying means configured to amplify the differential voltage ($V_{in\_a}$-$V_{in\_b}$) to the amplified voltage, the amplified voltage corresponding to the difference between a first output voltage and a second output voltage ($V_{out\_a}$-$V_{out\_b}$) wherein
      the rectified currents of the rectification and amplification circuit of the each stage being aggregated to provide a total rectified current,
      the first output voltage and the second output voltage of the rectification and amplification circuit of the each stage being provided as the first input voltage $V_{in\_a}$ and the second input voltage $V_{in\_b}$ to the rectification and amplification circuit of a subsequent stage, and
      the rectification circuit and amplification circuit of the each stage having substantially similar gain and rectification range.

2. The circuit of claim 1, wherein the first transconductor and the second transconductor comprise at least one of: a Bipolar Junction Transistor (BJT), a Heterojunction bipolar transistor (HBT), a Metal Semiconductor Field Effect Transistor (MESFET), a Junction gate Field Effect Transistor (JFET), a Metal Oxide Semiconductor Field Effect Transistor (MOSFET), and a Pseudomorphic High Electron Mobility Transistor (pHEMT).

3. A rectification and amplification circuit for generating a rectified current and an amplified voltage, the circuit comprising:
   an input portion comprising:
      a first transconductor and a second transconductor, source terminals of the first transconductor and the second transconductor being connected to a first current source and a second current source respectively, a source resistance connected between the source terminals of the first transconductor and the second transconductor, gate terminal of the first transconductor receiving a first input voltage $V_{in\_a}$ and a gate terminal of the second transconductor receiving a second input voltage $V_{in\_b}$, the first transconductor and the second transconductor converting a differential voltage between the first input voltage and the second input voltage into intermediate currents, the sum of intermediate currents having a magnitude of a tail current being provided by the first current source and the second current source; and
   an output portion comprising:
      a first transistor and a second transistor, a drain terminal of the first transistor being connected to a drain terminal of the second transistor, the drain terminal of the second transistor being connected to a drain terminal of the first transconductor, bulk terminals and source terminals of the first transistor and the second transistor being connected to a supply voltage, gate terminal of the first transistor being connected to the drain terminal of the second transistor;
      a third transistor and a fourth transistor, a drain terminal of the third transistor being connected to a drain terminal of the fourth transistor, the drain terminal of the fourth transistor being connected to a drain terminal of the second transconductor, bulk terminals and source terminals of the third transistor and the fourth transistor being connected to the supply voltage, a gate terminal of the third transistor being connected to the drain terminal of the fourth transistor, the gate terminals of the fourth transistor and the second transistor being cross connected with the drain terminals of the second transistor and the fourth transistor respectively, and a load resistance being connected between the drain terminals of the second transistor and the fourth transistor;
      a fifth transistor and a sixth transistor, gate terminals of the fifth transistor and the sixth transistor connected to the gate terminals of the first transistor and the third transistor respectively, bulk terminals and source terminals of the fifth transistor and the sixth transistor being connected to the supply voltage, drain terminals of the fifth transistor and the sixth transistor being connected to an output current terminal that provides the rectified current;
      a first output voltage terminal connected to the drain terminal of the second transistor and the drain terminal of the first transconductor, wherein a first output voltage is tapped from the first output voltage terminal; and
      a second output voltage terminal connected to the drain terminal of the fourth transistor and the drain terminal of the second transconductor, wherein a second output voltage is tapped from the second output voltage terminal,
      in which the amplified voltage corresponds to the difference between the first output voltage and the second output voltage.

4. The circuit of claim 3, wherein the first transconductor and the second transconductor are N-Channel Metal Oxide Semiconductor (NMOS) transistors.

5. The circuit of claim 3, wherein the first, the second, the third, the fourth transistor, the fifth transistor and the sixth transistor are P-Channel Metal Oxide Semiconductor (PMOS) transistors.

6. The circuit of claim 3, wherein the first transistor, the second transistor, the third transistor, the fourth transistor, the fifth transistor, the sixth transistor, the first transconductor and the second transconductor comprise at least one of a Bipolar Junction Transistor (BJT), Heterojunction bipolar transistor (HBT), a Metal Semiconductor Field Effect Transistor (MESFET), a Junction gate Field Effect Transistor (JFET), a Metal Oxide Semiconductor Field Effect Transistor (MOSFET), and a Pseudomorphic High Electron Mobility Transistor (pHEMT).

7. The circuit of claim 3, wherein the fifth and the sixth transistor operate as a current mirror by mirroring a current flowing in the first transistor and the third transistor respectively and providing the rectified current at the output terminal.

8. A multi-stage rectification and amplification circuit comprising a plurality of stages of rectification and amplification circuits, each rectification and amplification circuit generating a rectified current and an amplified voltage, the rectification and amplification circuit of each stage comprising:
  a first transconductor and a second transconductor configured to:
    receive a first input voltage $V_{in\_a}$ and a second input voltage $V_{in\_b}$; convert a differential voltage between the first input voltage and the second input voltage to intermediate currents, the sum of intermediate currents having a magnitude of a tail current being provided by a first current source and a second current source connected to the first transconductor and the second transconductor respectively;
  a rectifying means configured to convert the differential voltage ($V_{in\_a}-V_{in\_b}$) into the intermediate currents and selectively sum the intermediate currents to obtain the rectified current; and
  an amplifying means configured to amplify the differential voltage ($V_{in\_a}-V_{in\_b}$) to the amplified voltage, wherein the amplified voltage corresponds to the difference between a first output voltage and a second output voltage ($V_{out\_a}-V_{out\_b}$), wherein
    the rectified currents of the rectification and amplification circuit of the each stage being aggregated to provide a total rectified current; and
    the first output voltage and the second output voltage of the rectification and amplification circuit of the each stage being provided as the first input voltage $V_{in\_a}$ and the second input voltage $V_{in\_b}$ to the rectification and amplification circuit of a subsequent stage.

* * * * *